(12) United States Patent
Tanaka et al.

(10) Patent No.: US 11,908,972 B2
(45) Date of Patent: Feb. 20, 2024

(54) SEMICONDUCTOR LIGHT-EMITTING DEVICE AND OPTICAL COUPLING DEVICE

(71) Applicants: Kabushiki Kaisha Toshiba, Tokyo (JP); Toshiba Electronic Devices & Storage Corporation, Tokyo (JP)

(72) Inventors: Akira Tanaka, Yokohama Kanagawa (JP); Hideto Sugawara, Nonoichi Ishikawa (JP); Katsufumi Kondo, Nonoichi Ishikawa (JP); Masanobu Iwamoto, Kanazawa Ishikawa (JP); Kenji Isomoto, Kanazawa Ishikawa (JP); Hiroaki Ootsuka, Kanazawa Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 296 days.

(21) Appl. No.: 17/466,995

(22) Filed: Sep. 3, 2021

(65) Prior Publication Data

US 2022/0293817 A1    Sep. 15, 2022

(30) Foreign Application Priority Data

Mar. 15, 2021   (JP) .................. 2021-041036

(51) Int. Cl.
*H01L 33/06* (2010.01)
*H01L 31/173* (2006.01)
(Continued)

(52) U.S. Cl.
CPC ............ *H01L 33/06* (2013.01); *H01L 25/167* (2013.01); *H01L 31/02161* (2013.01);
(Continued)

(58) Field of Classification Search
CPC ............. H01L 31/167; H01L 31/02161; H01L 25/167; H01L 33/30; H01L 31/173; H01L 33/06

See application file for complete search history.

(56) References Cited

U.S. PATENT DOCUMENTS 5,425,042 A * 6/1995 Nido ..................... B82Y 20/00
                                                372/45.01
8,120,050 B2 * 2/2012 Konno .................... H01L 33/10
                                                257/256
(Continued)

FOREIGN PATENT DOCUMENTS

JP    2007-012688 A    1/2007
JP    2007-201040 A    8/2007
(Continued)

OTHER PUBLICATIONS

Tetsuji Imai et al., "Compound Semiconductor Device[I]", Kogyo Chosakai Publishing Co., Ltd., P88-89 (Jul. 15, 1984).

*Primary Examiner* — Savitri Mulpuri
(74) *Attorney, Agent, or Firm* — Knobbe, Martens, Olson & Bear, LLP (57) ABSTRACT

A semiconductor light-emitting device includes a substrate having a first energy bandgap, a first semiconductor layers on the substrate, an active layer on the first semiconductor layer, and a second semiconductor layer on the active layer. The active layer includes a quantum well layer, and a first barrier layer between the first semiconductor layer and the quantum well layer. The first semiconductor layer has a second energy bandgap wider than the first energy bandgap. The quantum well layer has a third energy bandgap narrower than the first and second energy bandgaps. The second semiconductor layer has a fourth energy bandgap wider than the third energy bandgap. The substrate has a refractive index greater than a refractive index of the first semicon- (Continued)

ductor layer. The refractive index of the first semiconductor layer is not less than a refractive index of the first barrier layer.

14 Claims, 4 Drawing Sheets

(51) Int. Cl.
*H01L 33/00* (2010.01)
*H01L 33/30* (2010.01)
*H01L 31/167* (2006.01)
*H01L 31/0216* (2014.01)
*H01L 25/16* (2023.01)

(52) U.S. Cl.
CPC .......... *H01L 31/167* (2013.01); *H01L 31/173* (2013.01); *H01L 33/30* (2013.01)

(56) References Cited

U.S. PATENT DOCUMENTS

| | | | |
|---|---|---|---|
| 8,258,529 B2* | 9/2012 | Konno | H01L 33/10 438/47 |
| 8,946,677 B2* | 2/2015 | Kang | H01L 33/14 257/94 |
| 2007/0075327 A1* | 4/2007 | Arai | H01L 33/14 257/103 |
| 2008/0149916 A1 | 6/2008 | Baba et al. | |
| 2013/0320299 A1* | 12/2013 | Li | H01L 33/08 438/35 |
| 2020/0161494 A1 | 5/2020 | Fujihara et al. | |

FOREIGN PATENT DOCUMENTS

| | | |
|---|---|---|
| JP | 2008-084974 A | 4/2008 |
| JP | 2009-238778 A | 10/2009 |
| JP | 2016-066817 A | 4/2016 |
| JP | 2020-088091 A | 6/2020 |

\* cited by examiner

SEMICONDUCTOR LIGHT-EMITTING DEVICE AND OPTICAL COUPLING DEVICE

CROSS-REFERENCE TO RELATED APPLICATIONS

This application is based upon and claims the benefit of priority from Japanese Patent Application No. 2021-041036, filed on Mar. 15, 2021; the entire contents of which are incorporated herein by reference.

FIELD

Embodiments relate to a semiconductor light-emitting device and an optical coupling device.

BACKGROUND

An LED (Light-Emitting Diode) including a light-emitting layer of an indium gallium arsenide mixed crystal is widely used as a light source in a wavelength range of 900 to 1000 nm in which a silicon photodiode is sensitive.

DETAILED DESCRIPTION

According to an embodiment, a semiconductor light-emitting device includes a substrate, a first semiconductor layer of a first conductivity type, an active layer, and a second semiconductor layer of a second conductivity type. The substrate has a first energy bandgap. The first semiconductor layer is provided on the substrate. The first semiconductor layer has a second energy bandgap wider than the first energy bandgap. The active layer is provided on the first semiconductor layer. The active layer includes at least one quantum well layer and a first barrier layer. The quantum well layer has a third energy bandgap narrower than the first and second energy bandgaps. The first barrier layer is provided between the first semiconductor layer and the quantum well layer. The second semiconductor layer is provided on the active layer. The second semiconductor layer has a fourth energy bandgap wider than the third energy bandgap. The substrate has a refractive index greater than a refractive index of the first semiconductor layer at a wavelength of light radiated from the active layer. The refractive index of the first semiconductor layer is not less than a refractive index of the first barrier layer.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

Figure 1:
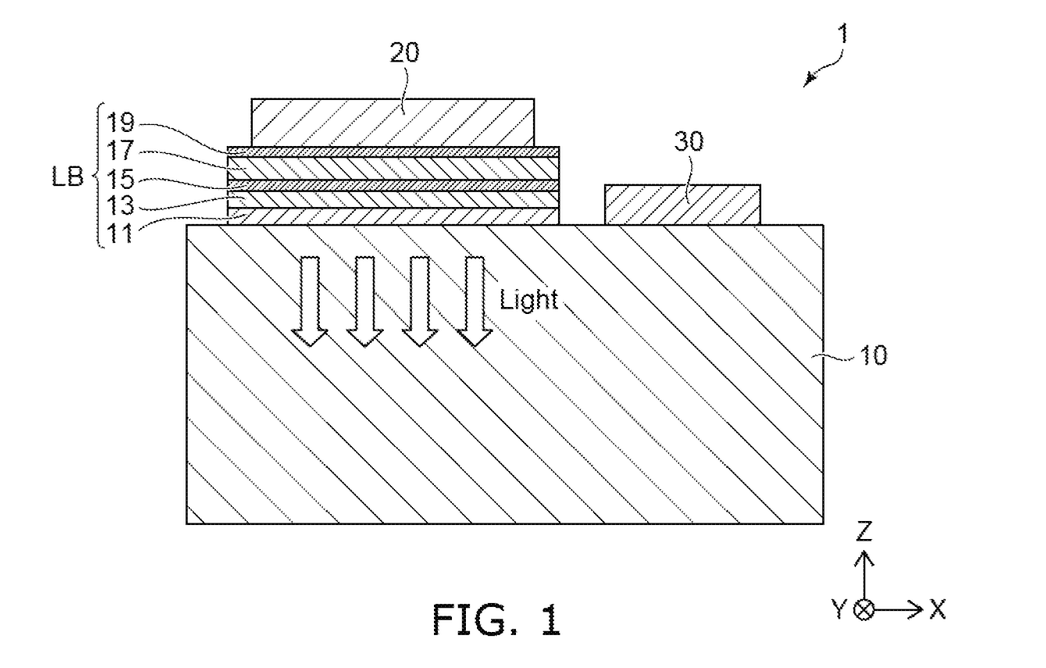
FIG. 1 is a schematic cross-sectional view showing a semiconductor light-emitting device according to a first embodiment.

FIG. 1 is a schematic cross-sectional view showing a semiconductor light-emitting device 1 according to a first embodiment. The semiconductor light-emitting device 1 is, for example, an LED that radiates infrared light in a wavelength range of 900 to 1000 nm.

As shown in FIG. 1, the semiconductor light-emitting device 1 includes, for example, a substrate 10, a light-emitting body LB, a first electrode 20, and a second electrode 30. The substrate 10 is, for example, a conductive semiconductor substrate. The substrate 10 may have a structure in which a semiconductor layer is provided on an insulating substrate. The substrate 10 includes, for example, gallium arsenide (hereinbelow, GaAs) of a first conductivity type. Here, the first conductivity type is described as an n-type, and a second conductivity type is described as a p-type, however, embodiments are not limited thereto.

The light-emitting body LB is provided on the substrate 10. The light-emitting body LB includes an intermediate layer 11, a first semiconductor layer 13, an active layer 15, a second semiconductor layer 17, and a third semiconductor layer 19.

The intermediate layer 11 is, for example, a buffer layer of the first conductivity type. The intermediate layer 11 is provided on the substrate 10. The intermediate layer 11 includes, for example, GaAs or an aluminum gallium arsenide mixed crystal (hereinbelow, AlGaAs) that is represented by the compositional formula $Al_xGa_{1-x}As$ ($0 < x < 1$).

The first semiconductor layer 13 is, for example, a cladding layer of the first conductivity type. The first semiconductor layer 13 is provided on the intermediate layer 11. The first semiconductor layer 13 includes, for example, AlGaAs. The AlGaAs of the first semiconductor layer 13 has an Al composition ratio $x = x1$.

The active layer 15 includes, for example, at least one quantum well. The active layer 15 is provided on the first semiconductor layer 13.

The second semiconductor layer 17 is, for example, a cladding layer of the second conductivity type. The second semiconductor layer 17 is provided on the active layer 15. The second semiconductor layer 17 includes, for example, AlGaAs. The AlGaAs of the second semiconductor layer 17 has an Al composition ratio $x = x2$. For example, the Al composition ratio $x2$ is not less than the Al composition ratio $x1$ of the first semiconductor layer 13.

The third semiconductor layer 19 is, for example, a contact layer of the second conductivity type. The third semiconductor layer 19 is provided on the second semiconductor layer 17. The third semiconductor layer 19 includes, for example, GaAs.

The intermediate layer 11, the first semiconductor layer 13, the active layer 15, the second semiconductor layer 17, and the third semiconductor layer 19 are sequentially formed on the substrate 10 by an epitaxial growth using, for example, MOCVD (Metal Organic Chemical Vapor Deposition). The light-emitting body LB is formed by mesa etching of the semiconductor layers that are epitaxially grown on the substrate 10.

The first electrode 20 is provided on the third semiconductor layer 19. The first electrode 20 is electrically connected to the third semiconductor layer 19. The first electrode 20 includes a material that has a high reflectance for the light radiated from the active layer 15. The first electrode 20 includes, for example, aluminum (Al) or gold (Au).

For example, the second electrode 30 is provided on the substrate 10 that is exposed by the mesa etching. The second electrode 30 is electrically connected to the first semiconductor layer 13 via the substrate 10 and the intermediate layer 11. The second electrode 30 also may be provided on the intermediate layer 11. The light-emitting body LB may be formed by, for example, mesa etching of the first semiconductor layer 13, the active layer 15, the second semiconductor layer 17, and the third semiconductor layer 19. In such a case, the mesa etching may be stopped when the intermediate layer 11 is exposed, and the second electrode 30 is formed on the intermediate layer 11. The second electrode 30 includes, for example, aluminum (Al) or gold (Au).

Figure 2:
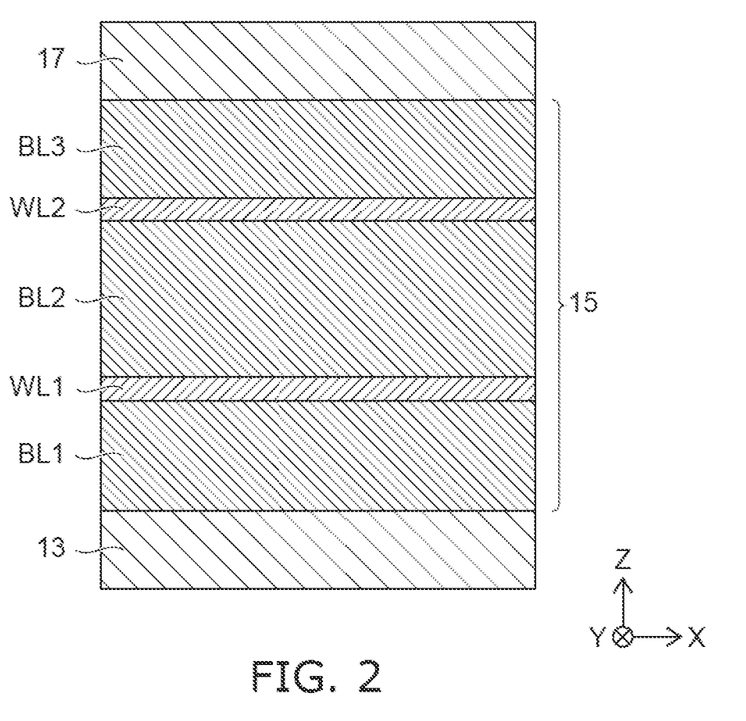
FIG. 2 is a schematic cross-sectional view showing the active layer of the semiconductor light-emitting device according to the first embodiment.

FIG. 2 is a schematic cross-sectional view showing the active layer 15 of the semiconductor light-emitting device 1 according to the first embodiment. The active layer 15 includes a first quantum well layer WL1 and a second quantum well layer WL2. Embodiments are not limited to the example; the active layer 15 may include one, three, or more quantum well layers.

The first quantum well layer WL1 and the second quantum well layer WL2 include, for example, an indium gallium arsenide mixed crystal (hereinbelow, InGaAs) that is represented by the compositional formula $In_yGa_{1-y}As$ ($0<y<1$).

As shown in FIG. 2, the first quantum well layer WL1 and the second quantum well layer WL2 are arranged in the direction from the first semiconductor layer 13 toward the second semiconductor layer 17, e.g., a Z-direction.

The first quantum well layer WL1 is provided between the first semiconductor layer 13 and the second quantum well layer WL2. The second quantum well layer WL2 is provided between the first quantum well layer WL1 and the second semiconductor layer 17.

A first barrier layer BL1 is provided between the first semiconductor layer 13 and the first quantum well layer WL1. A second barrier layer BL2 is provided between the first quantum well layer WL1 and the second quantum well layer WL2. A third barrier layer BL3 is provided between the first quantum well layer WL1 and the second semiconductor layer 17.

The first semiconductor layer 13 includes a first-conductivity-type impurity with a higher concentration than a concentration of the impurity in the first barrier layer BL1. The second semiconductor layer 17 includes a second-conductivity-type impurity with a higher concentration than a concentration of the impurity in the third barrier layer BL3.

The first barrier layer BL1, the second barrier layer BL2, and the third barrier layer BL3 include, for example, an aluminum gallium arsenide phosphide mixed crystal (hereinbelow, AlGaAsP) that is represented by the compositional formula $Al_xGa_{1-x}As_{1-y}P_y$ ($0<x<1$ and $0<y<1$). Alternately, at least one of the first barrier layer BL1 or the third barrier layer BL3 may include AlGaAs.

The first and second quantum well layers WL1 and WL2 include the InGaAs that has a greater lattice constant than a lattice constant of the GaAs included in the substrate 10 and the intermediate layer 11. Also, the lattice constant of the InGaAs is greater than the lattice constant of the AlGaAs included in the first and second semiconductor layers 13 and 17. That is, AlGaAs has a lattice constant that is near the lattice constant of GaAs.

The first to third barrier layers BL1, BL2, and BL3 include the AlGaAsP that has a smaller lattice constant than the lattice constant of GaAs. By providing the first to third barrier layers BL1, BL2, and BL3 that include the AlGaAsP, it is possible to compensate the stresses caused by the difference between the lattice constants of InGaAs and GaAs and the difference between the lattice constants of InGaAs and AlGaAs. Thereby, the generations of crystal defects such as dislocations, etc., can be suppressed in the second quantum well layer WL2 and the layers that are subsequently formed by the crystal growth. Also, by controlling the Al composition ratio x and the P composition ratio γ of the AlGaAsP, the lattice strain of the first and second quantum well layers WL1 and WL2 can be optimized to increase the luminous efficiency of the active layer 15.

In the semiconductor light-emitting device 1, a drive current flows between the first electrode 20 and the second electrode 30; and electrons and holes are injected into the active layer 15. The active layer 15 radiates light generated in the first and second quantum well layers WL1 and WL2 by the radiative recombination of electrons and holes. The light that propagates from the active layer 15 toward the first electrode 20 is reflected by the first electrode 20; and the propagation direction of the light is changed toward the substrate 10. As a result, the light radiated from the active layer 15 propagates toward the back surface of the substrate 10 (referring to FIG. 1).

For example, GaAs, AlGaAs, and AlGaAsP have wider energy bandgaps (hereinbelow, Eg or Egs) than InGaAs. Therefore, the substrate 10, the intermediate layer 11, the first semiconductor layer 13, the second semiconductor layer 17, and the third semiconductor layer 19 are substantially transparent to the light radiated from the active layer 15. Accordingly, the light generated in the active layer 15 is radiated through the back surface of the substrate 10 at the side opposite to the light-emitting body LB. Moreover, Eg of GaAs is narrower than Egs of AlGaAs and AlGaAsP.

To improve the light output of the semiconductor light-emitting device 1, it is preferable to suppress reflection or scattering of the light that propagates from the active layer 15 to the back surface of the substrate 10. For example, the relationship $n0 \geq n1 > n2 \geq nb$ is preferable for a refractive index n0 of the substrate 10, a refractive index n1 of the intermediate layer 11, a refractive index n2 of the first semiconductor layer 13, and a refractive index nb of the first barrier layer BL1. Moreover, considering the light that propagates from the active layer 15 toward the first electrode 20 and is reflected by the first electrode 20, it is more preferable for a refractive index n3 of the second semiconductor layer 17 to have the relationship $n3 < nb \leq n2 < n1 \leq n0$ in the direction from the second semiconductor layer 17 toward the back surface of the substrate 10 (i.e., −Z direction). Moreover, by reducing the refractive index differences between the adjacent semiconductor layers, the reflection and scattering of the light is preferably suppressed in the propagation path from the active layer 15 to the back surface of the substrate 10.

ILLUSTRATIVE EXAMPLE

The first semiconductor layer 13, the second semiconductor layer 17, the first barrier layer BL1, and the third barrier layer BL3 can include an aluminum gallium arsenide mixed crystal ($Al_xGa_{1-x}As$). In the following example, the Al composition ratio of the first semiconductor layer 13 is taken as x1, the Al composition ratio of the second semiconductor layer 17 is taken as x2, and the Al composition ratios of the first and third barrier layers BL1 and BL3 are taken as xb. When the Al composition x of AlGaAs increases, the refractive index decreases, and the Eg widens.

For example, the GaAs of the substrate 10 and the intermediate layer 11 has an Eg of about 1.4 eV. The first and second quantum well layers WL1 and WL2 have Egs of about 1.1 eV and emit light in a wavelength range of 900 to 1000 nm. The Eg difference thereof is about 0.3 eV. When the cladding layers (the first semiconductor layer 13 and the second semiconductor layer 17) include, for example, AlGaAs that has a wider Eg than the Eg of GaAs, the Eg difference is increased in the first and second quantum well layers WL1 and WL2 and the cladding layers. The trapping effect of the carriers (i.e., the holes) in the active layer 15 can be improved thereby, and the luminous efficiency of the active layer 15 may be increased.

In the example, the first and third barrier layers BL1 and BL3 also include AlGaAs in addition to the first and second semiconductor layers 13 and 17, and thus, the carrier confinement can be more significantly achieved in the first and second quantum well layers WL1 and WL2.

The substrate 10 is a GaAs substrate; and the intermediate layer 11 is a GaAs buffer layer. The first quantum well layer WL1 and the second quantum well layer WL2 include $In_{0.2}Ga_{0.8}As$. The second barrier layer BL2 includes $Al_{0.15}Ga_{0.85}As_{0.9}P_{0.1}$.

Figure 3:
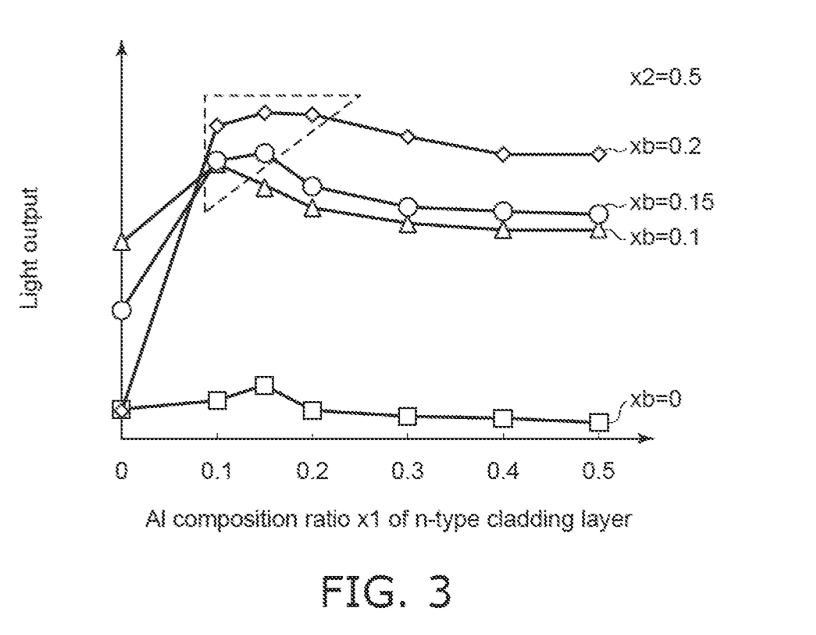
FIG. 3 is a graph showing characteristics of the semiconductor light-emitting device according to the first embodiment.

FIG. 3 is a graph showing characteristics of the semiconductor light-emitting device 1 according to the first embodiment. The horizontal axis is the Al composition ratio x1 of the first semiconductor layer 13 (e.g., the n-type cladding layer). The vertical axis is the light output. FIG. 3 shows the light output for the Al composition ratio x1 using the Al composition ratio xb of the first and third barrier layers BL1 and BL3 as a parameter. The Al composition ratio x2 of the second semiconductor layer 17 is 0.5.

The wavelength of the light that is radiated from the active layer 15 is, for example, 950 nm. The refractive index of GaAs is 3.54. The refractive index of AlGaAs changes depending on Al composition ratio x, for example, 3.48 (x=0.1), 3.47 (x=0.15), 3.42 (x=0.2), 3.36 (x=0.3), 3.31 (x=0.4), and 3.25 (x=0.5).

When the Al composition ratio xb equals 0, that is, when the first barrier layer BL1 and the third barrier layer BL3 are GaAs, the relationship becomes n0=n1=nb>n2. In other words, the magnitude relation of the refractive indexes is reversed in the first barrier layer BL1 and the first semiconductor layer 13. In the example, the light reflection at the interface between the first semiconductor layer 13 and the active layer 15 is increased. Also, the holes confined in the active layer 15 are leaked into the first semiconductor layer 13, and the luminous efficiency is reduced. Therefore, the light output becomes low.

When the Al composition ratio xb equals 0.1, and when the Al composition ratio x1 of the first semiconductor layer 13 is 0.1, the light output has a maximum value. The light output decreases as the Al composition ratio x1 of the first semiconductor layer 13 increases beyond 0.1. This is caused by the light reflection at the interface between the intermediate layer 11 and the first semiconductor layer 13, which increases as the refractive index difference increases between the first semiconductor layer 13 and the intermediate layer 11 that includes GaAs. When the Al composition ratio x1 is not more than 0.1, the energy barrier height between the active layer 15 and the first semiconductor layer 13 becomes lower. Therefore, the hole leakage from the active layer 15 into the first semiconductor layer 13 becomes pronounced and makes the radiative recombination in the first and second quantum well layers WL1 and WL2 decrease. Thus, the light output decreases.

When the Al composition ratio xb equals 0.15, and when the Al composition ratio x1 of the first semiconductor layer 13 is 0.15, the light output has a maximum value. The light output decreases as the Al composition ratio x1 increases beyond 0.2. This is caused by the light reflection at the interface between the first semiconductor layer 13 and the intermediate layer 11, which is increased as the refractive index difference increases between the first semiconductor layer 13 and the intermediate layer 11 that includes GaAs. On the other hand, when the Al composition ratio x1 is less than 0.1, the light output decreases due to the hole leakage from the active layer 15 into the first semiconductor layer 13.

When the Al composition ratio xb equals 0.2, and when the Al composition ratio x1 of the first semiconductor layer 13 is 0.15 to 0.2, the light output has a maximum value. The light output gradually decreases when the Al composition ratio x1 increases beyond 0.2. This is caused by the light reflection at the interface between the intermediate layer 11 and the first semiconductor layer 13, which increases as the refractive index difference increases between the first semiconductor layer 13 and the intermediate layer 11 that includes GaAs. On the other hand, when the Al composition ratio x1 is less than 0.1, the light output decreases due to the hole leakage from the active layer 15 into the first semiconductor layer 13.

Thus, by preferably controlling the Al composition ratios of the first semiconductor layer 13, the first barrier layer BL1 and the second barrier layer BL2, the light reflection can be suppressed at the interface between the first semiconductor layer 13 and the intermediate layer 11, and the light output can be improved. By providing the first semiconductor layer 13 with the Al composition ratio x1 not less than 0.1, the hole confinement effect in the active layer 15 can be improved. Thus, the light output may be increased. In other words, the light output of the semiconductor light-emitting device 1 can be improved by, for example, using Al composition ratios in the region shown by the broken line in FIG. 3. In this region, the Al composition ratios are such that x2>xb≥x1, and the relationship n0≥n1>n2≥nb>n3 can be achieved. The Egs of the first and third barrier layers BL1 and BL3 are wider than the Eg of the first semiconductor layer 13; and the carrier confinement effect can be improved in the first and second quantum well layers WL1 and WL2.

Second Embodiment

Figure 4A:
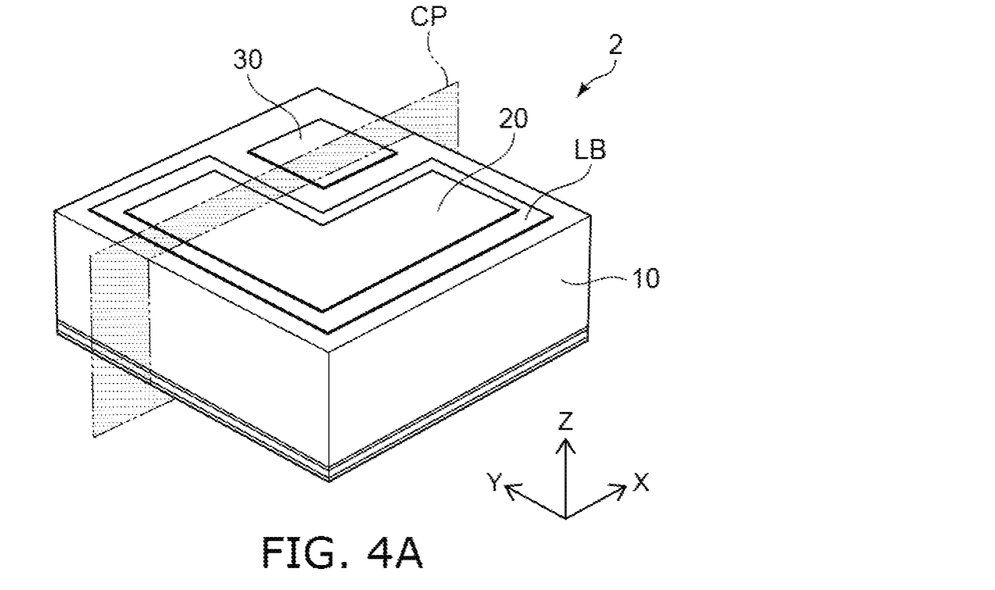
FIGS. 4A and 4B are schematic views showing an optical coupling device according to a second embodiment.
Figure 4B:
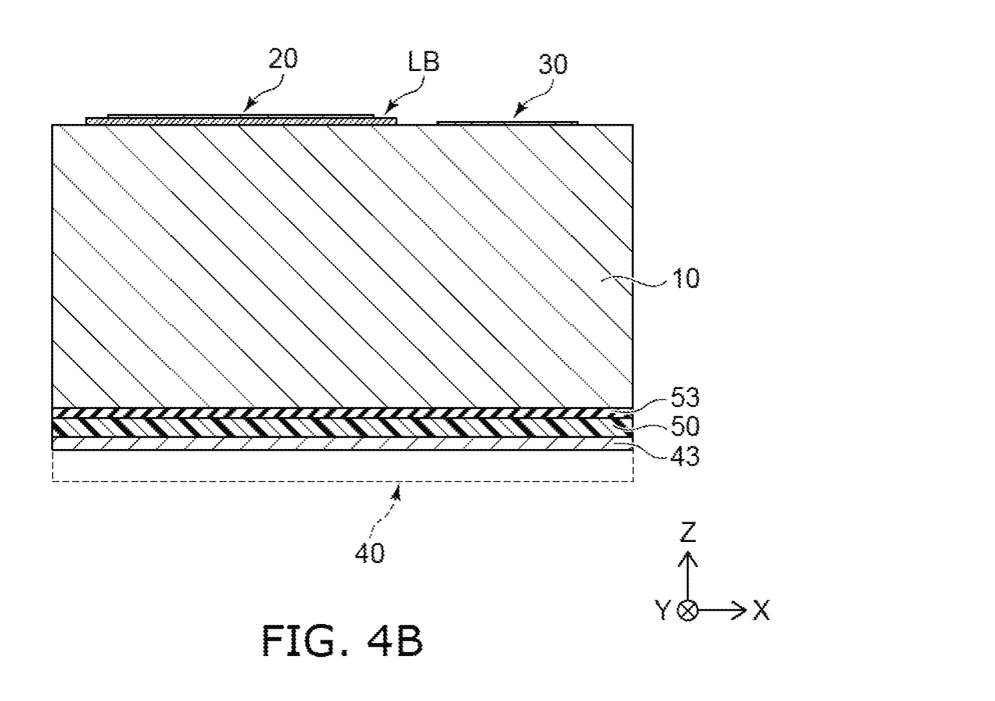

FIGS. 4A and 4B are schematic views showing an optical coupling device 2 according to a second embodiment. FIG. 4A is a perspective view showing the optical coupling device 2. FIG. 4B is a cross-sectional view along cross section CP shown in FIG. 4A. The optical coupling device 2 is a so-called photocoupler.

The optical coupling device 2 includes the substrate 10, the light-emitting body LB, the first electrode 20, and the second electrode 30. The light-emitting body LB is provided on the substrate 10. The first electrode 20 is provided on the light-emitting body LB. For example, the second electrode 30 is provided on the front surface of the substrate 10. For example, the second electrode 30 is provided at one corner of the rectangular front surface of the substrate 10. The light-emitting body LB and the first electrode 20 cover the remaining region of the substrate 10.

As shown in FIG. 4B, the optical coupling device 2 further includes a light-receiving element 40. The light-receiving element 40 is bonded via a resin layer 50 to the back surface of the substrate 10 at the side opposite to the light-emitting body LB. The light-receiving element 40 is, for example, a silicon photodiode. The resin layer 50 includes, for example, polyimide.

The resin layer 50 is adhered to the back surface of the substrate 10 via an insulating film 53. The insulating film 53 is, for example, a silicon oxide film or a silicon nitride film. The insulating film 53 improves the adhesion between the substrate 10 and the resin layer 50. The insulating film 53 also acts as an anti-reflection film between the substrate 10 and the resin layer 50. Also, the back surface of the substrate 10 may include an unevenness for increasing the light extraction efficiency.

The light-receiving element 40 includes a light-receiving layer 43. The light-receiving layer 43 is, for example, an epitaxial layer that is formed on a silicon substrate. The light-receiving layer 43 is bonded to the resin layer 50.

The resin layer 50 and the insulating film 53 are substantially transparent to the light that is radiated from the active layer 15 (referring to FIG. 1). The light that is radiated from the active layer 15 passes through the resin layer 50 and the insulating film 53 and is incident on the light-receiving layer 43.

The optical coupling device 2 can be mounted, for example, on a circuit board with the reduced footprint because the light-emitting element and the light-receiving element are in a stacked structure. Also, the package can be thinner by using the layer thickness of the resin layer 50 to control the spacing between the light-emitting element and the light-receiving element.

In the optical coupling device 2, it is preferable to uniformly irradiate the light on the light-receiving layer 43 of the light-receiving element 40. When the light is locally intensified at the front surface of the light-receiving layer 43, the current density may be locally increased, and the output voltage of the light-receiving element 40 may become unstable.

Figure 5:
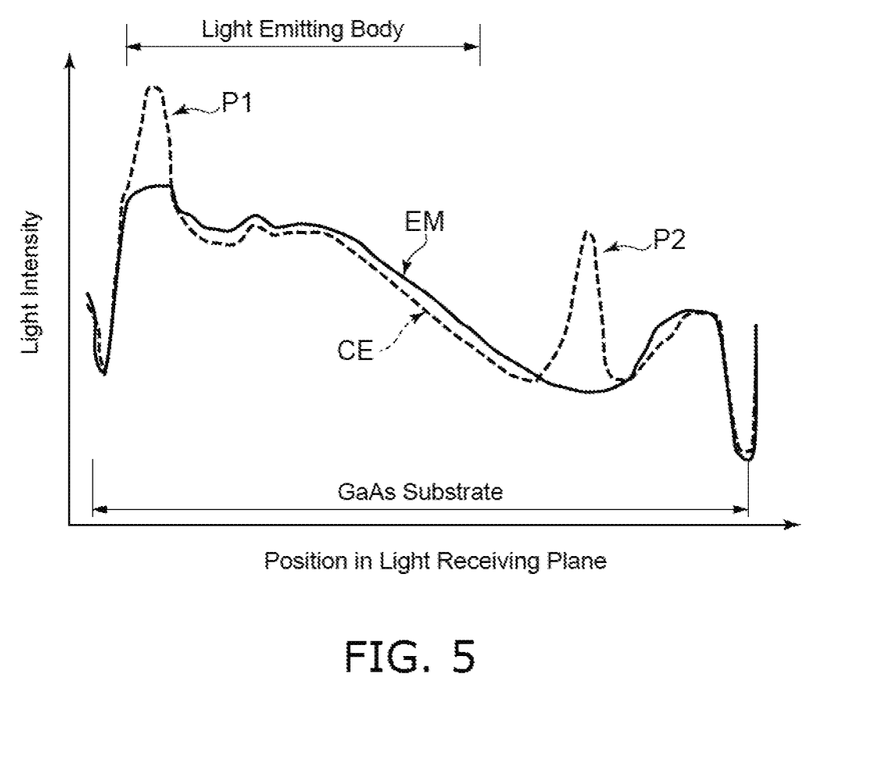
FIG. 5 is a graph showing characteristics of the optical coupling device according to the second embodiment.

FIG. 5 is a graph showing characteristics of the optical coupling device 2 according to the second embodiment. FIG. 5 illustrates the light intensity distribution in the light-receiving plane of the light-receiving element 40 in the cross section shown in FIG. 4B. FIG. 5 illustrates a light intensity distribution EM of the optical coupling device 2, and a light intensity distribution CE of a semiconductor light-emitting device according to a comparative example.

The light intensity distributions EM and CE shown in FIG. 5 can be determined by, for example, ray tracing. In the example, the calculations were performed using a refractive index of the resin layer 50 of 1.7, and a thickness of the resin layer 50 of 10 µm. Because the light intensity distribution was determined at a depth from the light-receiving plane of 1 µm, the thickness of the light-receiving layer 43 was set to 1 µm. Considering the absorption of silicon, a complex refractive index (3.59, $1.19 \times 10^{-3}$ at a wavelength of 950 nm was used.

The light-emitting body LB of the optical coupling device 2 had the same structure as the light-emitting body LB of the semiconductor light-emitting device 1. The refractive indexes of the substrate 10, the intermediate layer 11, the first semiconductor layer 13, and the active layer 15 had the relationship $n0=n1>n2 \geq nb$.

In the semiconductor light-emitting device according to the comparative example, the Al composition x1 of the first semiconductor layer 13 was 0.5. The refractive indexes of the layers of the substrate 10, the intermediate layer 11, the first semiconductor layer 13, and the active layer 15 had the relationship $n0=n1>nb>n2$. In other words, the cladding layer (the first semiconductor layer 13) of the first conductivity type had a smaller refractive index, and the buffer layer (the intermediate layer 11) of the first conductivity type had a larger refractive index in the light propagation path from the active layer 15 toward the back surface of the substrate 10.

As shown in FIG. 5, the light intensity distribution CE according to the comparative example has two intensity peaks P1 and P2. The intensity peak P1 appears in the light-receiving plane at a position proximate to the edge of the substrate 10 (the GaAs substrate) and below the light-emitting body LB. On the other hand, the intensity peak P2 appears in the light-receiving plane at a position below the second electrode 30.

It is considered that the intensity peaks P1 and P2 are generated by the effects of multiple reflections of the light at the interface between the intermediate layer 11 and the first semiconductor layer 13 and the interface between the first semiconductor layer 13 and the active layer 15. The intensity peaks P1 and P2 also may be affected by reflections at the side surface of the substrate 10, etc.

In an optical coupling device in which a light-emitting element and a light-receiving element are stacked, for example, the distance from the substrate 10 to the light-receiving element 40 in the Z-direction is less than the thickness of the substrate 10; and the refractive index of the resin layer 50 is greater than the refractive index of a normal transparent resin or insulating film (about 1.4). Therefore, it is difficult to reduce the reflection effects due to the refractive index difference in the light-emitting body LB by optimizing the stacked structure of the light-emitting element and the light-receiving element, etc.

In contrast, for the light intensity distribution EM of the optical coupling device 2, it can be seen that the intensity peaks P1 and P2 are not visible, and the light reflection in the light-emitting body LB is suppressed. The output voltage of the light-receiving element 40 can be stabilized thereby. Also, the light amount that is incident on the light-receiving element 40 through the substrate 10 is increased by suppressing the reflections and scattering in the propagation path of the light from the active layer 15 to the back surface of the substrate 10.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An optical coupling device, comprising:
  a semiconductor light-emitting device comprising:
    a substrate having a first energy bandgap;

a first semiconductor layer of a first conductivity type provided on the substrate, the first semiconductor layer having a second energy bandgap, the second energy bandgap being wider than the first energy bandgap;

an active layer provided on the first semiconductor layer, the active layer including at least one quantum well layer and a first barrier layer, the quantum well layer having a third energy bandgap narrower than the first and second energy bandgaps, the first barrier layer being provided between the first semiconductor layer and the quantum well layer; and a second semiconductor layer of a second conductivity type provided on the active layer, the second semiconductor layer having a fourth energy bandgap wider than the third energy bandgap, the substrate having a refractive index greater than a refractive index of the first semiconductor layer at a wavelength of light radiated from the active layer, the refractive index of the first semiconductor layer being not less than a refractive index of the first barrier layer at the wavelength of the light radiated from the active layer; and a light-receiving element configured to receive the light radiated from the active layer of the semiconductor light-emitting device, the substrate of the semiconductor light-emitting device being provided between the active layer and the light-receiving element, the light-receiving element being bonded to the substrate via a resin layer, and the resin layer transmitting the light radiated from the active layer.

2. The device according to claim 1, wherein
the second semiconductor layer having a refractive index less than the refractive index of the first semiconductor layer at the wavelength of the light radiated from the active layer.

3. The device according to claim 1, further comprising:
an intermediate layer of the first conductivity type provided between the substrate and the first semiconductor layer, the intermediate layer having a fifth energy bandgap wider than the third energy bandgap,
the intermediate layer having a refractive index higher than the refractive index of the first semiconductor layer at the wavelength of the light radiated from the active layer.

4. The device according to claim 3, wherein the refractive index of the intermediate layer is less than the refractive index of the substrate.

5. The device according to claim 1, wherein
the active layer further includes a second bather layer provided between the quantum well layer and the second semiconductor layer, the second barrier layer including a material having a same composition as a material of the first barrier layer.

6. The device according to claim 1, wherein
the active layer further includes a second bather layer provided between the quantum well layer and the second semiconductor layer, the second bather layer including a material having a different composition from a material of the first barrier layer.

7. The device according to claim 1, wherein
the active layer includes first and second quantum well layers, the first barrier layer, a second bather layer and a third bather layers, the first quantum well layer being provided between the first semiconductor layer and the second quantum well layer, the second quantum well layer being provided between the second semiconductor layer and the first quantum well layer, the first barrier layer is provided between the first semiconductor layer and the first quantum well layer, the second barrier layer is provided between the second quantum well layer and the second semiconductor layer, and the third barrier layer is provided between the first quantum well layer and the second quantum well layer.

8. The device according to claim 1, wherein
the active layer includes a plurality of quantum layers and a plurality of bather layers, the plurality of quantum layers including first and second quantum well layers, the plurality of barrier layers including the first barrier layer, a second barrier layer and a third barrier layers, the first quantum well layer being provided between the first semiconductor layer and the second quantum well layer, the second quantum well layer being provided between the second semiconductor layer and the first quantum well layer, the first barrier layer is provided between the first semiconductor layer and the first quantum well layer, the second barrier layer is provided between the second quantum well layer and the second semiconductor layer, and the third barrier layer is provided between the first quantum well layer and the second quantum well layer.

9. The device according to claim 7, wherein
the first to third barrier layers include a material of a same composition.

10. The device according to claim 7, wherein
at least one of the first and third barrier layers includes a material having a different composition from a material of the second bather layer.

11. The device according to claim 1, wherein
the substrate includes gallium arsenide,
the first semiconductor layer includes a first aluminum gallium arsenide mixed crystal, and
the first barrier layer includes a second aluminum gallium arsenide mixed crystal,
the first aluminum gallium arsenide mixed crystal having an aluminum composition ratio not more than an aluminum composition ratio of the second aluminum gallium arsenide mixed crystal.

12. The device according to claim 11, wherein
the second semiconductor layer includes a third aluminum gallium arsenide mixed crystal,
the third aluminum gallium arsenide mixed crystal having an aluminum composition ratio greater than the aluminum composition ratio of the first aluminum gallium arsenide mixed crystal and the aluminum composition ratio of the second aluminum gallium arsenide mixed crystal.

13. The device according to claim 1, wherein
the active layer further includes a second barrier layer provided between the quantum well layer and the second semiconductor layer,
the quantum well layer including an indium gallium arsenide mixed crystal,
the first barrier layer including an aluminum gallium arsenide mixed crystal, the second barrier layer including an aluminum gallium arsenide phosphide mixed crystal.

14. The device according to claim 1, wherein the active layer further includes a second barrier layer provided between the quantum well layer and the second semiconductor layer, the quantum well layer including an indium gallium arsenide mixed crystal, the first barrier layer and the second barrier layer including aluminum gallium arsenide phosphide mixed crystals.

* * * * *